United States Patent
Carrozzi

[19]

[11] Patent Number: 5,986,531
[45] Date of Patent: Nov. 16, 1999

[54] ELECTROMAGNETIC SHIELDING DEVICE FOR NUCLEAR MAGNETIC RESONANCE APPARATI

[75] Inventor: Alessandro Carrozzi, La Spazia, Italy

[73] Assignee: Esaote S.p.A., Monferrato, Italy

[21] Appl. No.: 08/907,904

[22] Filed: Aug. 11, 1997

[30] Foreign Application Priority Data

Aug. 22, 1996 [IT] Italy ................................ RM9600591

[51] Int. Cl.⁶ ................................................. G01R 33/20
[52] U.S. Cl. .......................... 335/301; 324/318; 600/421; 600/415
[58] Field of Search ............................. 335/301; 324/318, 324/319; 600/415, 421, 422; 174/35 R, 35 GC, 35 CE, 35 MS

[56] References Cited

U.S. PATENT DOCUMENTS

| | | | |
|---|---|---|---|
| 4,564,812 | 1/1986 | Van Dijk | 324/309 |
| 4,613,820 | 9/1986 | Edelstein et al. | 324/318 |
| 4,725,781 | 2/1988 | Röschmann | 324/318 |
| 4,920,318 | 4/1990 | Misic et al. | 324/318 |
| 5,028,872 | 7/1991 | Nakabayashi | 324/318 |
| 5,050,999 | 9/1991 | Van Loon, III | 383/76 |
| 5,735,278 | 4/1998 | Hoult et al. | 128/653.2 |

FOREIGN PATENT DOCUMENTS 60-242350  2/1985  Japan .

OTHER PUBLICATIONS

Magnetic Resonance in Medicine 2, 169–175 (1985); Thian C. Ng. et al.; pp. 169–175.

*Primary Examiner*—Michael L. Gellner
*Assistant Examiner*—Raymond Barrera
*Attorney, Agent, or Firm*—Burns, Doane, Swecker & Mathis LLP

[57] ABSTRACT

Electromagnetic shielding device for nuclear magnetic resonance apparati, having a cavity (5) with at least one or more openings for introducing the body (K) or the part thereof under examination, which cavity (5) is defined by at least one magnet (1) for generating a static field, one or more coils for generating a magnetic field gradient (2), one or more coils (3) for generating spin-exciting radio-frequency pulses, and one or more coils (4) for receiving echo signals. The transmitting (3) and receiving coils (4) are contained in an electromagnetic shielding structure (7, 7', 7"), at the openings of the detection cavity (5), whereat the shielding structure may be closed by removable shielding elements (9, 10, 18, 20), electrically connectable thereto. According to the invention, the elements (9, 10, 18, 20) for closing the shield (7, 7', 7") are at least partially provided with openings for the passage of body parts or define openings for the passage of body parts (K), and may be fastened or compressed, with a predetermined force, against said body parts (K), in such a way as to close the opening and generate a safe low-impedance electrical contact between the body (K) and said closing elements (9, 10, 18, 20).

30 Claims, 5 Drawing Sheets

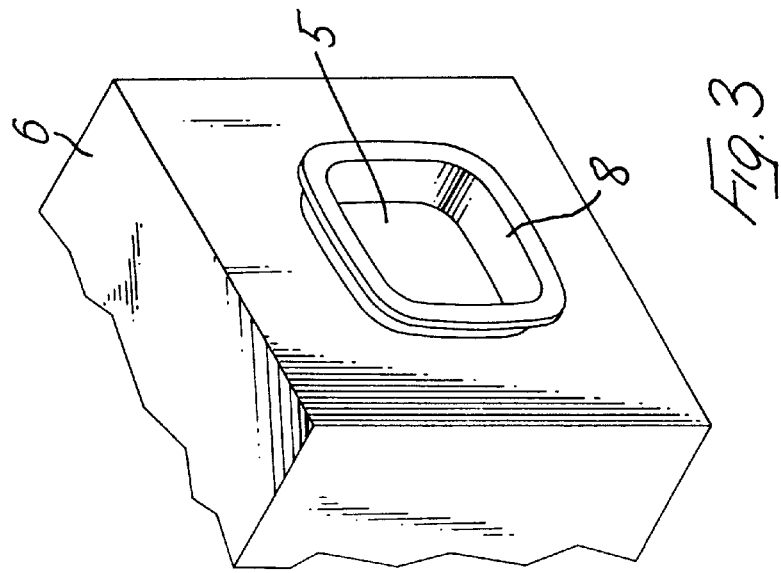
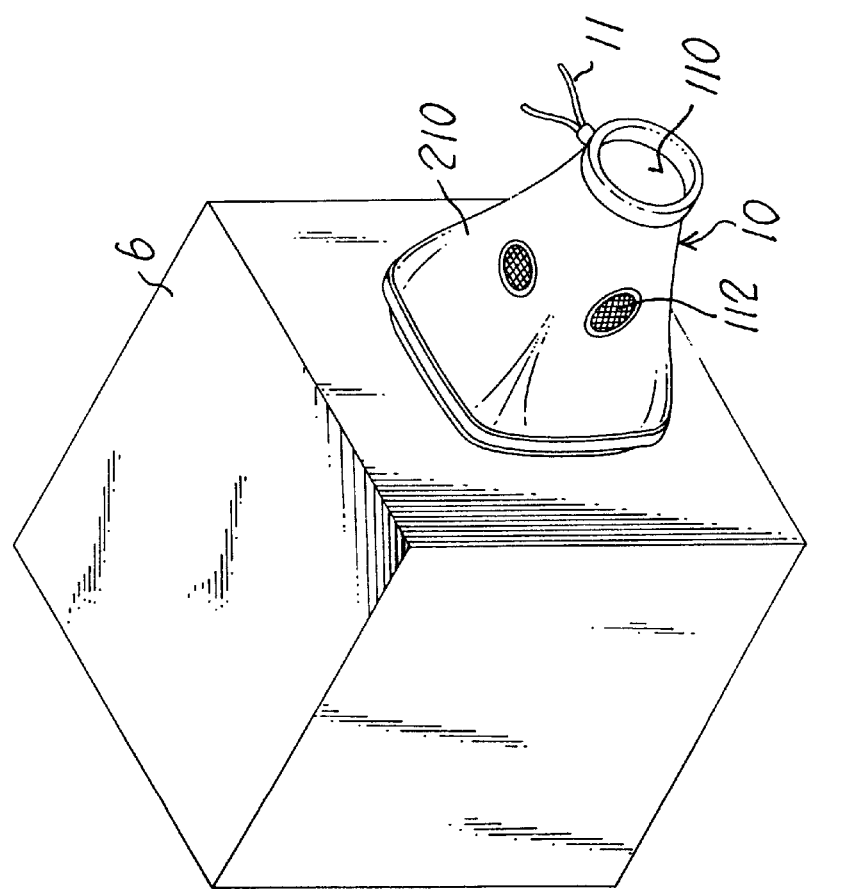

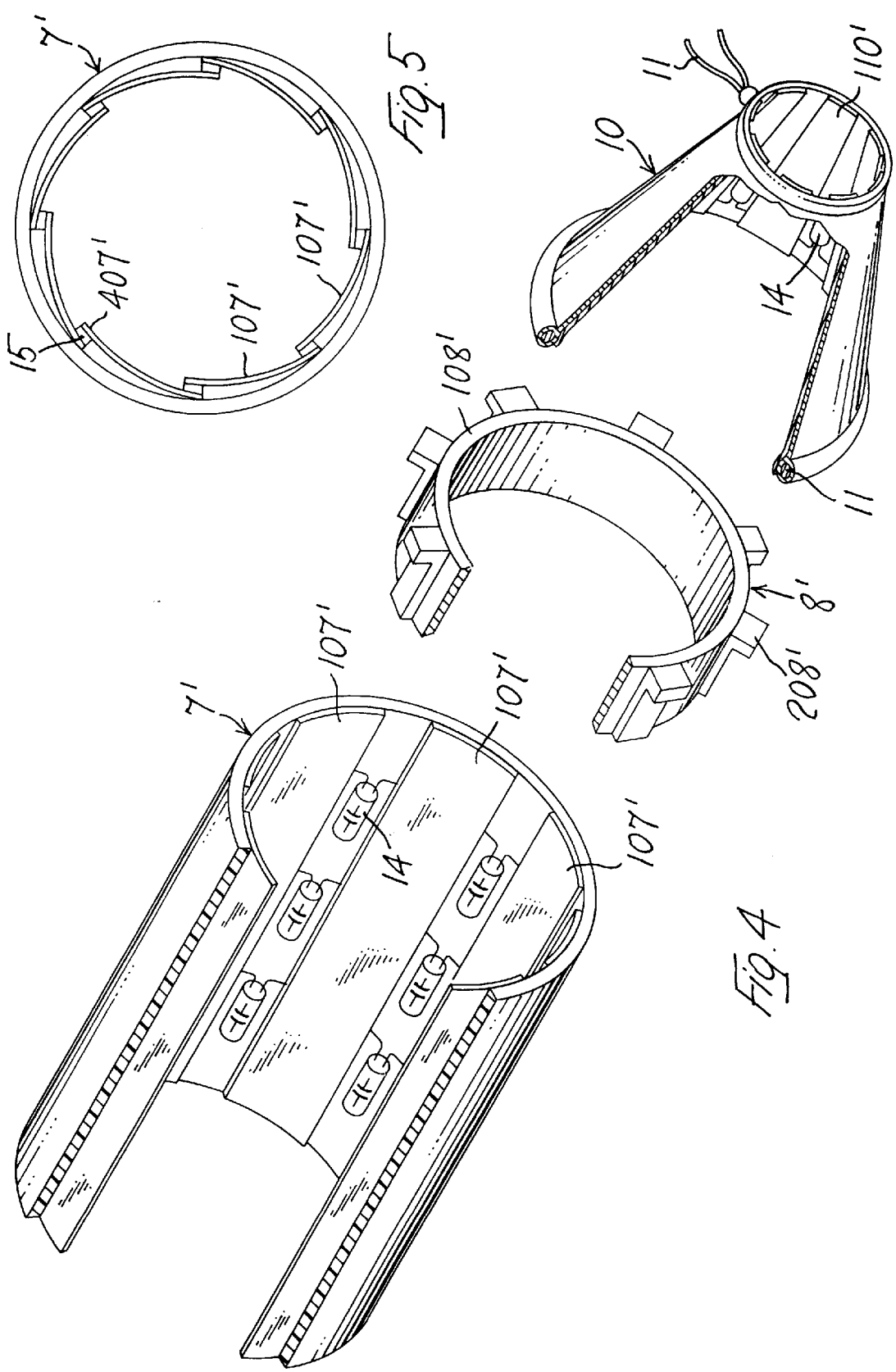

ELECTROMAGNETIC SHIELDING DEVICE FOR NUCLEAR MAGNETIC RESONANCE APPARATI

BACKGROUND OF THE INVENTION

1. Field of the Invention

The invention relates to an electromagnetic shielding device for nuclear magnetic resonance apparati.

2. Discussion of Related Art

U.S. Pat. No. 4,725,781 discloses such a shielding device. Particularly, the shielding device is provided as combined with a nuclear magnetic resonance image detecting apparatus, of the type adapted to contain, in its cavity, only one body part. The cavity, which is substantially defined in shape by the shape of the coil of the magnet for generating the static field is tubular and open at its ends. The stationary part of the electromagnetic shield is stably integrated into the magnetic structure of the apparatus, and is positioned radially inside the coils for generating the gradient field, and radially outside the coils for transmitting nuclear spin exciting pulses. At the open ends, the electromagnetic shield is also open, and may be entirely or partially closed by electrically conductive elements, which may be removably applied at the ends of the cavity and electrically connected to the stationary part of the shield.

The open end of the cavity, through which no body part is intended to pass, may be completely closed. The end of the cavity through which the body part is intended to enter into the detection area, is only partially closed by a removable shielding element, with an opening which is reduced, according to the body size, with respect to the span of the opening of the cavity. The shielding means are in contact with the body or the part thereof passing through them, to penetrate the cavity. Although the device disclosed by U.S. Pat. No. 4,725,781 allows to eliminate or anyway drastically reduce magnetic noise infiltrating inside the cavity, by entirely closing or minimizing the eventual opening/s through which the body to be examined may reach the detection area of the cavity, this effect is completely neglected in said document. The shielding is not aimed at preventing noise infiltrations, but at ensuring a higher concentration of the field lines of the RF transmitting and/or receiving coils. Particularly, no emphasis is placed on keeping the open areas of the detection cavity far from the image zone, that is from the receiving coil, on the contrary, in order to obtain the purposes stated in the document, the effectiveness of the shielding increases as the inner volume of the shield is decreased, i.e. as the latter approaches the image zone. Moreover, this type of shielding is absolutely ineffective against electrical noise. Particularly in nuclear magnetic resonance image detection machines for predetermined body parts, a considerable part of the body remains outside the detection cavity and acts as an antenna, through which electrical variations penetrate up to the detection area of the cavity, and particularly up to the body part under examination, and so up to the receiving coils.

Furthermore, since nuclear magnetic resonance apparati are used by operators which are unskilled in the knowledge of physics, the above mentioned patent does not deal with the problem of user-friendliness of shields, particularly with respect to the operations of assembling and disassembling the parts which are meant to be associated to the openings of the cavity or of the detection volume.

Appearance and comfort are also important for the patient who should not be shocked during his treatment, and especially should not be frightened but reassured by the appearance of the apparatus.

The article entitled "Shielded solenoidal probe for in vivo NMR studies of solid tumors" by Th. C. N G, J. D. Glickson, published in "Magnetic Resonance in Medicine", vol. 2, 1985 provides, for the study of cutaneous and subcutaneous tumors, the introduction of a mouse into a metal cylinder connected to ground, which cylinder has an opening with a variable span, from which a part of the tumor tissue to be examined is made to protrude. In this case, the combination of the animal and the shielding cylinder is inserted into the cavity and into the area being relevant for nuclear magnetic resonance image acquisition. The shielding is used to eliminate the echoes coming from the innermost parts of the body of the animal with respect to the outer areas, having the tumor cells to be examined. Electromagnetic noise which may eventually affect the quality of the acquired image and which come from outside are not a problem. The reason is that the tested element, that is the animal, may be completely introduced into the cavity for image detection in such a distant position from the openings that it is anyway not much exposed to electromagnetic noise.

OBJECTS AND SUMMARY

Therefore, the invention is based on the problem of providing an electromagnetic shielding device for nuclear magnetic resonance apparati, particularly for apparati being meant to detect images of predetermined body parts which, thanks to simple and cheap expedients, reduce or eliminate both magnetic and electrical noise coming from outside, while having a construction providing a simple, comfortable and reliable use thereof by the medical staff, and being also comfortable, non-traumatic and visually reassuring for the patient.

An additional object of the invention is to provide such shielding devices so that they may be used in the same way or with negligible differences in nuclear magnetic resonance image detection apparati having more than two opposite openings and a detection cavity whose shape is not closed in itself, especially in apparati having a C-shaped geometry.

The invention achieves the above objects by providing a device as described herein, in which the removable elements for closing the shield at the opening/s of the detection cavity, which elements are provided with passage openings for body parts, may be fastened or compressed against said body parts in such a way as to close the opening and generate a safe low-impedance electrical contact between the body and said elements for closing the shield and the shield itself.

As a result of this feature, the body of the patient may be connected to the shield and thus to ground, and as a result the eventual electrical noise is also neutralized.

In order to improve the electrical contact between the body and the element for closing the shield on the open side/s of the detection cavity, i.e. generally between the skin of the patient and said element, it is possible to use electrolytic substances, to be applied to the skin in the contact area.

According to an additional characteristic, which may be combined or alternative, a band may be fastened around the body part, said band being made of an electrically conductive material both on the inner surface being in contact with the skin and on the outer surface being fastened and compressed by the corresponding element for closing the open side of the detection cavity, said element being in turn connected to the stationary part of the shield.

The band which is fastenable around the body has the advantage of offering a larger surface for contact with the skin, helping to reduce the resistance of the electrical contact area. This allows to exceed and maintain the values of shield-skin contact resistance within mean values that may be accepted for the desired shielding effects, regardless of the different characteristics of electrical conductivity of the skin.

According to an additional characteristic, the elements for closing the shield, which are provided with openings for the insertion of the body, are given a certain predetermined length, between the end being attached to the shielding structure and the end being in contact with the body, in such a way as to keep the opening of the shielding structure as far as possible from the image zone.

Advantageously, the elements of the shield, which may be removably mounted at the opening/s are made of flexible and deformable elements having, as a conductive material, at least one layer of electrically conductive metal wire mesh, for example made of copper, or similar.

Alternatively, it is also possible to use a metallized fabric, or sheets made of other conductive materials, preferably having suitable characteristics of deformability and flexibility, such as, for example, aluminium sheets, or similar.

When the body part intended to make electrical contact with the shield has a substantially cylindrical symmetry and may be entirely held inside the span of at least one opening, the elements for closing the open sides of the shield are advantageously made of sleeves of flexible material and with a truncated cone shape, which are open at the two bases of the truncated cone, wherein there are also provided means for removable contact on the one side with electrical connectors to the stationary shield and on the other side with the body of the patient, said means being electrically connected to a layer of mesh made of an electrically conductive material.

To ensure contact with the body, the sleeve has a coulisse in which a fastening string is made to slide. This ensures a perfectly closed form of the truncated cone-shaped sleeve.

On the side being connected to the stationary part of the shield, the means for mechanical/electrical connection may be made of removable snap coupling elements, such as snap fasteners, made of conductive material, or of means as the so-called "Velcro", having conductive characteristics, which are electrically connected, on the sleeve, to the conductive layer of mesh, whereas in the detection area, they form a crown extending along the edge of the opening/s of the detection area, each snap fastener, or other means, being electrically connected to the corresponding end of the stationary part of the shield.

Alternatively, on the side connected to the stationary shield, the sleeve may have a coulisse with a fastening string held therein, like on the side connected to the body, while in this case, the stationary shield ends with an annular flange, having an L-cross section, which projects out of the machine case, and surrounds the opening/s of the detection cavity.

When the detection cavity has a nonround, i.e. polygonal shape, the sides of the fastening flange of the sleeve, being accordingly polygonal, are advantageously arched, in an outwardly convex sense, that is in the direction of the surface being in contact with the coulisse of the sleeve.

When one or more openings of the detection cavity are not at least partially filled with any body part, the element for closing said open side/s is made in the form of a continuous curtain, and may be fixed in such a way as to be in electrical contact with the corresponding parts of the stationary shield, both thanks to the flange, by radial fastening, and by means of snap fasteners, as previously described. Even in this case, the closing elements may be made of the same flexible material as the one forming the sleeve.

According to an additional embodiment and eventually in combination with the means described hereinbefore, the elements for closing the stationary electromagnetic shield at the open side/s of the detection cavity, or at least at part of the open side/s of the detection cavity, consist of a plurality of preshaped compressible stuffed elements, like cushions or similar, which are externally coated with a layer of an electrically conductive material, for example of the same copper mesh as provided inside the sleeve, and are inserted through slight forcing between the body part, passing through or substantially filling the open side/s and the ends of the stationary shield, at the edge of said side/s.

The contact with the body is of the compression type, like in the sleeve of the previous example. The contact with the ends of the stationary shield at the opening/s of the detection cavity is obtained through compression contact surfaces, or through means like snap fasteners, or yet through means made of tapes as the so-called VELCRO, made of a conductive material, with one part thereof being associated to the cushions, and the other being provided along the delimiting edge of the opening/s of the detection cavity, and being in electrical contact with the corresponding end of the stationary shield.

Instead of simple cushions, being stuffed with a compressible material, like sponge rubber, or other foamed materials, there may be also provided cushions, being at least partially inflatable and removably fixed at the opening/s of the detection cavity, and in a condition of electrical contact with the stationary shield, in the same manner as previously described.

The cushions may be pre-shaped. Therefore, for example in the case of a cavity being defined by a tubular wall, the cushions may be shaped accordingly, either of one single piece or in composable sectors, and with facing surfaces for mutual electrical contact.

The combination of the different solutions proposed herein allows to provide an effective shielding even with detection cavities having geometries differing from the tubular one, which has only two open sides at its ends.

Particularly, the combined use of the solutions disclosed above, allows to obtain an effective shielding even with magnets having C-cross sections, being open on three sides. These magnets are designed to perform RMN analyses also in the shoulder area. In this case, the patient is lying on an examination table, which is movable relative to the magnet bringing the shoulder into the relevant area of the detection cavity.

Since the patient lies on the examination table, and the latter generally superposes the lower wall delimiting the detection cavity, the means provided in this embodiment for closing the stationary shield at the open side/s of the detection cavity are on the examination table itself, and the patient rests upon them. The electrical contact with the corresponding end of the stationary shield may be obtained through contacts passing through the examination table itself.

In an embodiment, the cushion is fixed to the upper side of the examination table and is connected to connectors, for example snap fasteners or other contacts provided on the upper side of the examination table, whereas said contacts are connected to the stationary shield, in the operating position, by wiping contacts, projecting out of the lower side of the examination table, and interacting with contact plates provided along the edge of the opening/s of the detection cavity, said plates being also in electrical contact with the stationary shield.

In a variant embodiment, the examination table has apertures, for the insertion of the extensions of the cushion/s, which extensions are connected to the stationary shield, by removable coupling connectors, for example like the snap fasteners described above.

The inner shield may be made in different manners, particularly of a continuous conductive sheet, supported by a substrate of rigid insulating material.

According to an improvement, in order to prevent the free circulation of currents induced by the magnetic noise in the electromagnetic shield from negatively affecting the variation speed of the field of the gradient coils, the shield may be made of a plurality of sectors, having the form of partial-surface foils, being side-by-side and slightly spaced, whereas the single sectors are connected through condensers with a predetermined capacitance, based on the working frequency of the machine, so that the total capacitance between one sector and the one next to it is of a few pF/cm of length of the adjacent sides, at a frequency of about 8 MHz. By this arrangement, the shield offers a continuous action for radio-frequency magnetic noise, that is included in the range of transmitting and receiving frequencies. For circulating currents having such frequencies, the condensers, when properly dimensioned, do not act as obstacles, and so the shielding is operating. For field variations having lower frequencies, such as those involved by the activation and the disactivation of the gradient coils, which are in the order of a few KHz, the currents induced by the flow variation, when the field is generated or disactivated, are effectively blocked by the capacitive connections between the individual foils, and are prevented form circulating freely. In this case, the shielding action does not occur, and the shield is perfectly transparent to the field generated by the gradient coils.

This construction may eventually be extended to the elements for closing the shield on the open sides of the cavity.

Further, instead of the condensers, being connected with their pins to two adjacent sectors, the foils of which the sectors are made may form the condensers, by partially overlapping the foils of two adjacent sectors, and by interposing a suitable dielectric between them.

The capacitance of the capacitive junction between two sectors depends on the overlapping surface and on the type of dielectric.

BRIEF DESCRIPTION OF THE DRAWINGS

The characteristics of the invention and the advantages deriving therefrom will appear more clearly from the following description of some non limiting embodiments, illustrated in the annexed drawings, in which:

FIGS. 2 and 3 are two perspective views of the device according to FIG. 1, with and without the sleeve mounted thereto.

FIG. 4 is an exploded perspective view of an apparatus according to FIG. 1, having a cylindrical tubular cavity.

FIG. 5 is a variant of the embodiment according to FIG. 4.

DETAILED DESCRIPTION OF THE PREFERRED EMBODIMENTS

Figure 1:
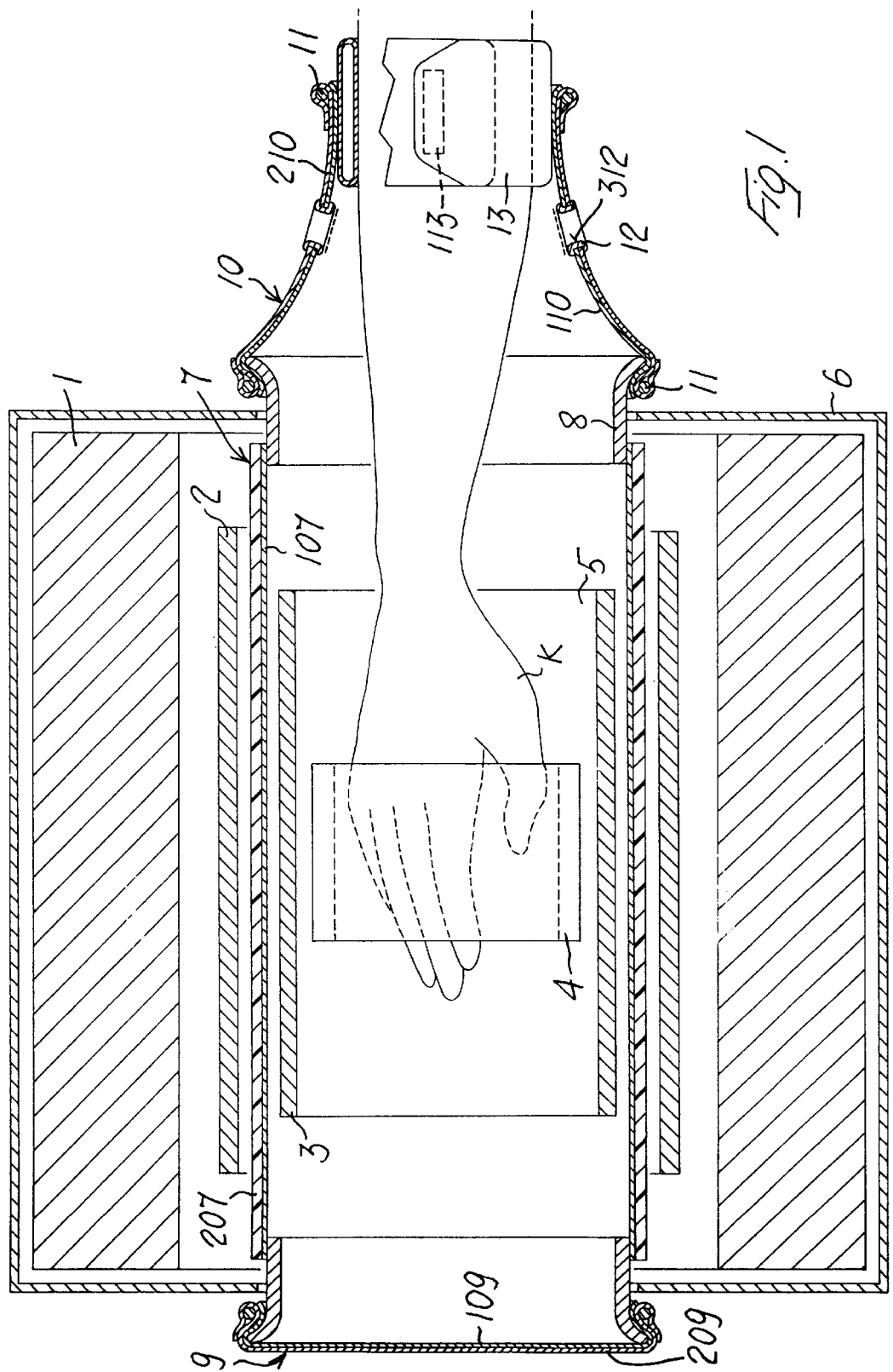
FIG. 1 is an axial sectional view of a nuclear magnetic resonance image detection apparatus of the type meant for the analysis of some body parts, and having a rectangular shaped tubular detection cavity.

Referring to FIG. 1, a nuclear magnetic resonance image detection apparatus comprises a magnet for generating a static field 1, a gradient coil 2, one or more coils 3 for transmitting radio-frequency spin exciting pulses, and one or more coils 4, for receiving echoes from nuclear spins. The magnet for generating the static field 1 has an annular shape, and defines, together with the other coils, a tubular detection cavity 5, in which the receiving coil/s 4 are held and into which the body K or the part thereof to be examined are inserted. The whole is enclosed in a protecting case 6, defining the inner wall of the tubular cavity 5. The transmitting coils/s 3 are disposed inside the gradient coil 2 and the receiving coil/s may be generally removably mounted therein. In an intermediate position, between the transmitting coil/s 3 and the gradient coil 2, there is provided an electromagnetic shield 7, which extends substantially concentrically with respect to the wall delimiting the detection cavity 5, entirely enclosing it. The shield is generally made of a sheet of an electrically conductive material 107, which is attached, for example glued, to the inner surface of a supporting panel, which is accordingly folded or deformed in a cylindrical, tubular shape, and is made of plastic or of another insulating material 207.

The shielding sheet 107 is connected to ground, with its edges at the open ends of the detection cavity 5 being connected to a respective outer annular flange 8, having a L-shaped section, with respect to an axial plane.

In this way, the said annular flange 8 forms an element for mechanical removable attachment and electrical connection between the shielding sheet 107 and an element for closing the shield on the open ends of the latter, at the openings of the shielding cavity 5.

Said closing elements 9, 10 may be fixed to the flange 8. They may be made, as required by different cases, of a cover or wall of which the side 109 being in contact with the flange 8 is made of an electrically conductive material, such as a metal wire mesh, whereas externally it is made of an insulating fabric layer, such as synthetic fibers, or similar, said cover 9 entirely closing the corresponding opening of the detection cavity 5, or of a substantially truncated cone-shaped sleeve 10, with a predetermined length, which has an opening for inserting a body part, eventually projecting out of the detection cavity 5.

The two elements 9, 10 are interchangeable and allow to close the electromagnetic shield either completely or leaving an aperture for the insertion of the body. In FIG. 1, the body part under examination is the hand, and so the flanges 8 have, on one side the cover 9, and on the other the sleeve 10 mounted thereon. If a knee were to be examined, for example, then another sleeve 10 should be provided instead of the cover 9.

Alternatively, the cover 9 may be made in the form of a dome or cap, so as to form a compartment for holding the end portion of the body or adhering thereto, which projects to a predetermined small extent out of the associated opening of the detection cavity 5, thus adhering to the form of the body K, without having to break the shielding structure, like for the sleeve 10.

While the cover 9 electrically closes the whole open side of the shield, the sleeve 10 has different functions. First, it reduces the span of the open side of the cavity 5 to which it is associated. Further, it keeps the position of the aperture far from the area of the cavity in which the echoes of nuclear spins are detected, and furthermore it is provided with fastening means around the corresponding body part K, which projects out of the detection cavity 5.

Like the cover 9, the sleeve has, internally, an electrically conductive fabric layer 110, at least partially made of metal wires, whereas, externally, it is provided with an insulating fabric layer 210, for example made of synthetic fibers. The two fabric layers 110, 210 are glued or anyway attached in a different manner, eventually sewed. At the two ends, the two fabrics are folded in such a manner as to form a coulisse for the passage of a string 11 for fastening, on one side the L-shaped flange 8, and on the other side, the body of the patient. The two fabrics are outwardly folded together, so that the coulisse has the electrically conductive fabric 110 on the outside, allowing to generate the electrical contact between the sleeve 10 and the flange and the sleeve 10 and the body K. This is also valid for the cover 9, but only as regards the flange 9.

The sleeve 10 has also ventilation apertures 312, allowing for a certain amount of air circulation, thus preventing an excessive perspiration of the patient.

Advantageously the ventilation apertures 312 are delimited by slots 12, which are made of an electrically conductive material at least on the side of the electrically conductive fabric 110. Moreover, as shown in FIG. 2, the slots 12 may bear a gauze 112 extending on the span of the ventilation aperture, which may also be made of an electrically conductive material.

In order to improve the electrical contact with the skin, while keeping the resistivity at a mean acceptable level, substantially independent from the particular physiological conditions of the skin of the patient, the sleeve 10 is not directly fastened on the body K of the patient, but on an openable band 13, also preferably made of electrically conductive fabric, both on the inner side, in contact with the skin, and on the outer side, in contact with the sleeve. The band 13 is open, and has closing means 113 at its ends, for example of the type known as VELCRO, or similar. The band 13 has a predetermined width, based on the conditions for ensuring a minimum resistivity of contact between the skin and the band, through different physiological conditions.

Naturally, the band 13 may be also provided with different means providing contact with the sleeve 10, for example also means of the snap fastener type (not shown), which snap fasteners are distributed along the extension of the corresponding end of the sleeve 10, and, in a substantially coincident position, along the band itself, and which snap fasteners are made of an electrically conductive material, and are connected, both mechanically and electrically, to the electrically conductive fabric layers of said two parts.

According to an additional characteristic, the detection cavity 5, and thus the flanges 8, which form the extension of the stationary part of the shield 7, may have a polygonal, for example rectangular, cross section. In this case, the flanges 8, also rectangular, have sides which are not perfectly straight, but slightly outwardly arched, and rounded edges. This allows to obtain a contact, along the whole extension of the sleeve 10, with the flange 8, and to avoid a fastening tension, exerted with sharp edges and perfectly straight sides, which causes insufficiently stable contacts along the whole extension of the flange and of the corresponding coulisse for fastening the sleeve 10.

In FIGS. 4 and 5, a variant embodiment of the shield according to the previous figures is shown. In this case, at least the stationary shield 7, is not composed of a continuous shielding foil, but of a plurality of spaced sectors 107', connected by condensers 14. In the illustrated figure, the spacings between the individual foils 107' have been exaggerated. The foils extend for the whole axial length of the shielding sheet. This embodiment allows to prevent the shield 7 from taking effect also against the magnetic field variations generated by the gradient coil 2. The gradient coil 2 is not constantly active, but is alternately activated. When it is activated, the field grows progressively and, in the shield 7, the flow variation generates circulating currents which partially shield the gradient field, i.e. more precisely, which delay the attainment of the operational value. Thanks to the difference between the frequency of the noise acting on the transmitting pulses, and on the received echoes, being in the range of radio-frequencies, and the frequency involved by the activation of the gradient coil 2, being in the order of a few KHz, the capacitance of condensers may be chosen in such an amount as to allow for induction, in the shield, of circulating currents due to a noise which is relevant for transmission and reception, and as to be an obstacle to the generation, in the shield 7, of shielding circulating currents, due to the variation of the magnetic flow, when the gradient coils are activated.

The ideal capacitance is found to be of about 10 pF/linear cm of length of the facing edges of two adjacent foils 107', at frequencies of about 8 MHz.

As shown in FIG. 4, this construction of the shield may be extended, if desired and appropriate, to the sleeve or to the eventual cover 9, 10. In this case, the L-shaped flange 8 is made of an annular supporting element 108', made of an insulating material, and bearing, on its outer surface, a crown of L-shaped electrical contacts 208', each for one of the foils 107', and in electrical contact therewith. In the sleeve 10, in coincidence with the individual L-shaped contacts 208' of the flange 8', there is provided, in turn, a crown of strips made of electrically conductive fabric 110', which are spaced and connected by condensers 14, like the shield 7'.

In the variant of FIG. 5, it is possible not to use separate components for the condensers 14, the latter being integrated in the construction and consisting in overlapping areas 407', of the individual adjacent foils 107'. Between the two overlapping parts of adjacent foils 107', an appropriate spacing element made of dielectric 15 is interposed. The capacitance by linear cm of length of the foils is controlled through the surface of the two overlapping foil parts 107', and the dielectric.

Figure 7:
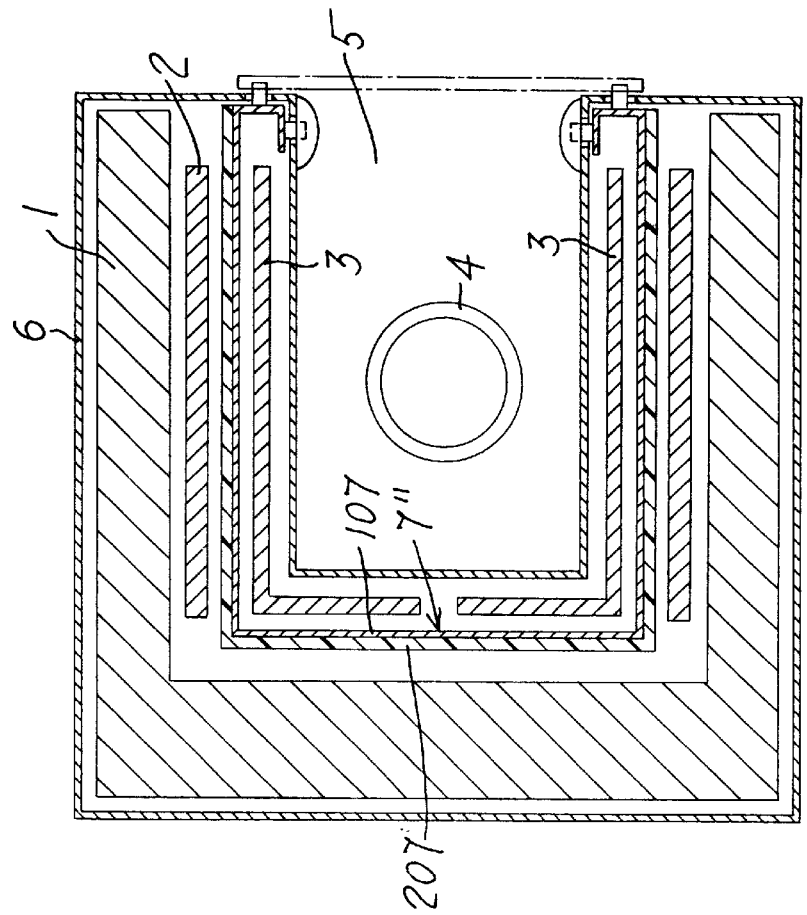
FIG. 7 is a cross-sectional view of the apparatus according to FIG. 6.
Figure 6:
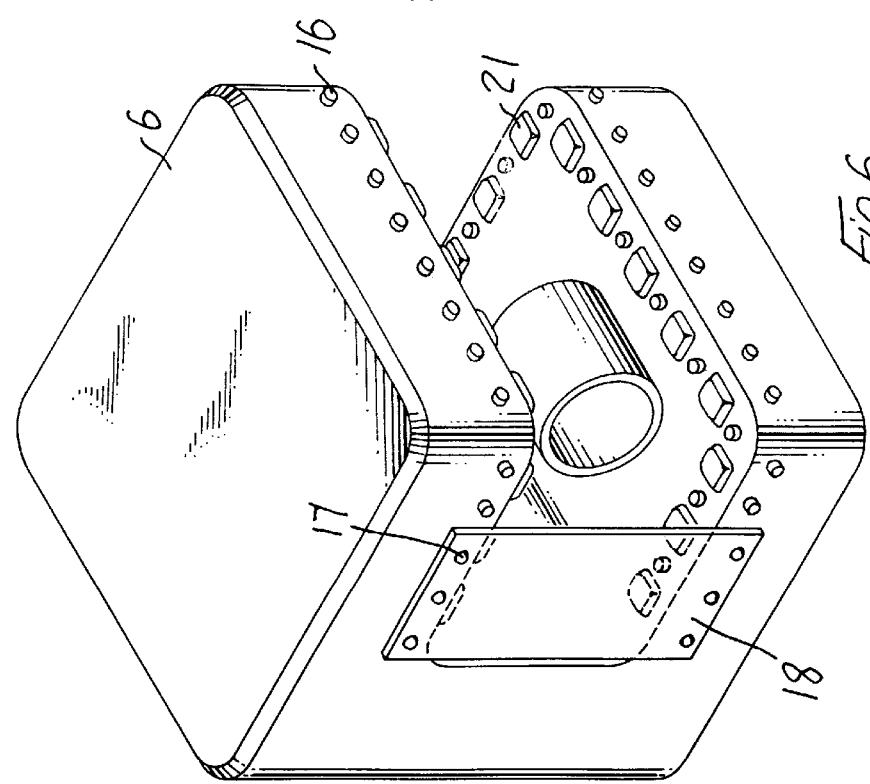
FIG. 6 is a perspective view of a shield according to the invention used in an apparatus having a C-shaped magnet.
Figure 8:
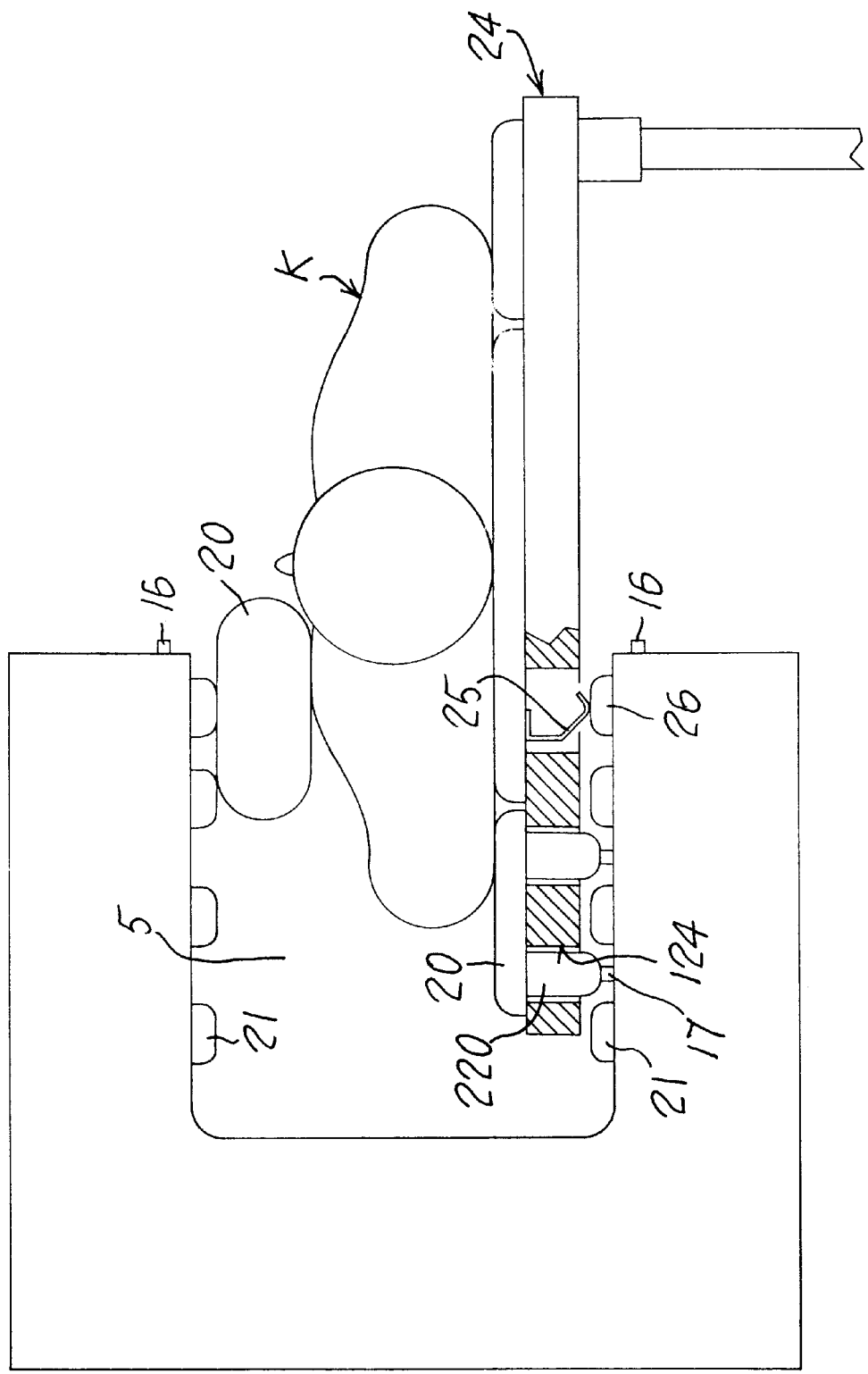
FIG. 8 shows a C-shaped magnet according to the previous figures, with a patient housed in the corresponding cavity for analyzing the shoulder.

FIGS. 6, 7, and 8, show the structure of the magnet and of the cavity 5 in a different nuclear magnetic resonance image detection device. In this example, the geometry of the magnet is C-shaped, so the cavity 5 is open on three sides. The magnet for the magnetic field 1 is C-shaped, and so is the electromagnetic shield 7".

In FIGS. 6, 7, 8 all parts like those described with reference to the previous examples will be referred to with the same reference numerals.

The shield 7" is connected, along the peripheral edges of the wall delimiting the cavity 5, to a plurality of metal fixtures of curtain-like elements 18, which may be made of a material similar to that forming the sleeve 10 or the covers 9. In this case, instead of the flange, each curtain has at its opposite ends a row of first metal, electrically conductive parts of snap fasteners, referred to as 17, with a row of second parts of snap fasteners 16 corresponding thereto along the edges of the openings of the detection cavity 5. The first parts of the snap fasteners 17 are in electrical contact with the electrically conductive fabric forming the curtains 18, whereas the second parts are in electrical contact with the corresponding edge of the shield 7". Eventually, the curtains have an opening for the introduction of a limb into the cavity 5, which opening is or may be removably associated to a sleeve, being substantially like the sleeve 10, at least in the terminal portion providing contact with the body and as for the truncated cone shape. As a result, by providing an appropriate series of at least two or more curtains, with variable, or different standard lengths, the shield 7" may be closed on all sides of the cavity 5, around body parts inserted therein, thus obtaining the advantages of the previous embodiment.

This is valid particularly when the limbs under examination consist of a hand or a knee. Even in this case, bands may be used to improve the electrical contact with the body.

On the contrary, when, as shown in FIG. 8, the C-shaped geometry of the magnet is used for examining limbs like a shoulder or similar, the curtains 18 may no longer be advantageously used, as combined with sleeve-like elements, to effectively close the shield. In this case the body K of the patient is partially outside the cavity, practically on all open sides thereof, and therefore no sleeve-like elements as those used for the hand or the leg, may be provided. As shown in FIG. 8, along the edges of the open sides of the detection cavity, and on the facing surfaces of said edges, generally in a substantially horizontal position, there is externally provided a row of contact plates or automatic contact means 21 so that elements in the form of cushions 20 are pushed against them or attached thereto. These cushion elements 20 are internally made of an elastic material, such as sponge rubber, or other foamed materials, and are externally coated with an electrically conductive mesh, for example the same fabric 110 as that forming the inner layer of the sleeve 10. Said elements are forced between the patient and the plates 21 or the fixtures 16, thus generating an electrical contact between the body of the patient and the shield 7".

The areas of the openings of the cavity 5, which are left completely clear of the body, may be closed using the curtains 18, which may have means for electrical connection to the cushions. The means for automatic fastening and electrical connection to the shield 7" may be made, again, of first and second parts of automatic fasteners 16, 17, the ones attached to the shield 7" and the others to the cushions 20.

This may be provided both above and below the patient. However, as is apparent from FIG. 8, when the surfaces defined by the two branches of the C shape of the magnet are horizontal, the patient is brought to the examination position by using an examination table, also penetrating the detection cavity 5.

In this case, the electrical connection between the body of the patient and the shield 7", may no longer be established, unless through the examination table 24.

The possible solutions are manifold. As is apparent from FIG. 8, in one case the lower cushions are associated to the examination table 24 and connected to one or more wiping contacts 25 borne by it, and projecting out of its lower side, which wiping contacts 25 may be connected to the cushions by means of snap fasteners, like in previous cases, or by other means and interact with contact plates 26, connected to the ends of the shield 7" in the corresponding position.

An alternative form provides, that the examination table has passage slots 124, through which the cushions 20 are connected to contact plates or to second parts of snap fasteners, being associated or electrically connected to the shield 7", through extensions which penetrate the slots 124 and bear, in predetermined positions, the first parts of the snap fasteners.

In all the embodiments illustrated and described herein, electrical noise is removed by connecting the shield to ground, thereby the electromagnetic noise picked up by the body of the patient is eliminated. The strictly magnetic noise is eliminated by reducing the shield and by closing it around the detection cavity 5, as well as by keeping the eventual openings, which are also reduced, far from the area of the detection cavity, in which the examination takes place.

Naturally, the invention is not limited to the embodiments described and illustrated hereinbefore, but may be greatly varied, especially as regards construction. Thus, for example, the embodiment relating to the division of the conductive sheet into more adjacent sectors, connected by condensers, may be also extended to the shield associated to the C-shaped magnet. Further, for all means illustrated and described herein, there may be provided an alternative or combined use, in order to meet different needs, in different areas of the openings of the detection cavity 5. All this without departing from the inventive principle disclosed above and claimed below.

I claim:

1. In a nuclear magnetic resonance apparatus including an electromagnetic shielding device, which apparatus has a cavity with an opening for introducing a part of a body under examination, and which cavity is defined by at least one magnet for generating a static field, one or more coils for generating a magnetic field gradient, one or more coils for generating spin-exciting radio-frequency pulses, and one or more coils for receiving the echo signals generated by spin excitation inside the body or the part thereof under examination, said electromagnetic shielding device comprising:

an electromagnetic shielding structure made of conductive material, which has an opening at the opening of the cavity, said shielding structure connectable to ground, removable shielding means electrically connectable to the shielding structure at a first end for reducing infiltration of electromagnetic noise from outside to inside of the cavity in an amount being significant for acquisition of echoes and transmission of excitation pulses, the removable shielding means being provided with an opening at a second end for passage of the part of the body, said opening including means for closing said opening against which the part of the body may be pressed with a predetermined force in such a way as to close the opening of the removable shielding means, and the removable shielding means including means for generating a safe low-impedance electrical contact between the part of the body and said removable shielding means and the shielding structure.

2. The device as claimed in claim 1, wherein, in combination with the removable shielding means, which may be fastened around the body part, or pressed against it, there is provided a band, externally and internally made of an electrically conductive material, the internal and external sides being in electrical contact with each other, and which band may be applied and/or fastened all around the body part, and closed in such a way that the two ends are in electrical contact, and which band has a predetermined width.

3. The device as claimed in claim 1, wherein the shielding structure comprises a sheet made of an electrically conductive sheet, continuous or net-shaped, providing a continuous electrical contact.

4. The device as claimed in claim 1, wherein the removable shielding means, which are provided with openings for the insertion of the body part have a predetermined length between an end being attached to the shielding structure and an end being in contact with the body part, in such a way as to keep the opening of the shielding structure as far as possible from an image zone.

5. The device as claimed in claim 1, wherein the removable shielding means are in the form of covers, having a dome or a cap shape, so as to form compartments for holding the body part or adhering thereto, which slightly project out of the corresponding opening of the cavity, with no need to open or break the shielding structure.

6. The device as claimed in claim 1, wherein the removable shielding means prevents the infiltration of the electromagnetic noise.

7. The device as claimed in claim 1, wherein the removable shielding means partially closes the shielding structure.

8. The device as claimed in claim 1, wherein the removable shielding means entirely closes the shielding structure.

9. The device as claimed in claim 1, wherein the shielding structure has a plurality of openings and the removable shielding means completely closes at least one of the openings of the shielding structure.

10. The device as claimed in claim 9, wherein for each opening of the shielding structure there is provided a combination of different closing elements for closing at least part or the whole of said each opening of the shielding structure.

11. The device as claimed in claim 10, wherein at least one of the closing elements has or defines openings for the passage of the part of the body.

12. Device as claimed in claim 10, wherein the closing elements are made in a series of predetermined sizes for the passage of the part of the body.

13. The device as claimed in claim 1, wherein the cavity is open on three sides, a magnetic structure of the nuclear magnetic resonance apparati which includes the at least one magnet having a C shape, and the shielding structure being also provided with a corresponding C shape, whereas along delimiting sides of the cavity, there is provided a row of contact plates and a row of second parts of means for removable attachment and electrical contact, both on an outer end surrounding said opening of the cavity and along end strips of the delimiting sides, which contact plates and which second means for removable attachment and electrical contact are electrically connected to the shielding structure, whereas, as combined therewith, there are provided elements for at least partially closing the opening of the shielding structure which are of a curtain and/or a cushion type and/or of a curtain type combined with a sleeve, the latter provided with an opening and with means for fastening the body part.

14. The device as claimed in claim 13, wherein the cavity, delimited by walls having a C shape is oriented with two branches of the C shape being in a substantially horizontal sense, whereas there is provided, as combined therewith, an examination table, for insertion and motion of the body part in such a position as to fill at least partially only one, two or all three openings of the cavity, said examination table overlapping, with a supporting surface, a wall delimiting a lower of the two branches, there being provided cushions on a side which bears the body part and cushions for closing openings of the cavity, left between the body part and an opposed delimiting wall of the cavity, eventually as combined with curtain elements, provided in areas of the opening which are not even partially filled by the body part, whereas the cushions on the side which bears the body part, and the supporting surface of the examination table connected to the shielding structure by means of contacts passing through the examination table.

15. The device as claimed in claim 14, wherein, in a peripheral strip, along the openings of the cavity, there are provided contact plates, interacting with wiping contacts which are provided on a lower side of the examination table and are connected to electrical contact means on an upper side, on which the cushions are held.

16. The device as claimed in claim 14, wherein at least part of the cushions has at least one, preferably more lower extensions which, passing through apertures in the supporting surface of the examination table come to contact with plates being in contact with the shielding structure, or bear first means for removable mechanical attachment and electrical connection, being engageable with second means for removable attachment and electrical connection, associated and electrically connected to the shielding structure, for example first and second parts of metal snap fasteners, in electrical contact with an electrically conductive fabric of the associated cushion and with the shielding structure, respectively.

17. The device as claimed in claim 1, wherein the shielding structure comprises sectors made of an electrically conductive material, which sectors are electrically isolated from each other, that is spaced to a predetermined extent, and are connected to adjacent ones of the sectors by capacitive contacts, i.e. condensers having a predetermined capacitance, the distribution and shape of the sectors and the capacitance of the condensers being determined and chosen so as to ensure the circulation, inside the shielding structure of currents induced by electromagnetic noise having frequencies in a range of frequencies of excitation pulses and spin echoes, that is of a few MHz and so as to block the circulation, inside the shielding structure of currents induced by electromagnetic noise being in a range of a few KHz, i.e., the frequency of alternate activation of the gradient coils.

18. The device as claimed in claim 17, wherein a conductive fabric layer of the removable shielding means is made of isolated sectors, connected through a capacitive electrical connection, and including means for electrical connection between the shielding structure and the removable shielding means being made in such a way as to connect each of the sectors of the shielding structure to one of the sectors of the removable shielding means.

19. The device as claimed in claim 17, wherein there are provided more than one condenser for the connection of two adjacent sectors along their opposed edges, the capacitance of the condensers being determined so as to be in the order of magnitude of a few pF/linear cm.

20. The device as claimed in claim 19, wherein a capacitive connection between adjacent sectors of the shielding structure is provided by partially superimposing the two opposed edges of two adjacent sectors, for a predetermined overlapping surface, and by interposing suitable spacers, made of a suitable dielectrical material, between the two overlapping parts of the sectors, in order to obtain a desired capacitance.

21. The device as claimed in claim 1, wherein the removable shielding means include one or more covers, one or more sleeves, one or more curtains, or a combination thereof which are made, at least on the side being in contact with the part of the body and with the means for generating contact with the shielding structure, of a mesh made of a conductive material.

22. The device as claimed in claim 21, wherein the removable shielding means include a truncated cone-shaped sleeve which, at least at the end associated to the body part has a passage opening, surrounded by a coulisse, holding a string for fastening the sleeve to the body part.

23. The device as claimed in claim 21, wherein the removable shielding means have an outer fabric layer made of insulating fabric of synthetic fibers, being anchored to the mesh made of a conductive material.

24. The device as claimed in claim 23, wherein the cavity has a tubular wall, the shielding structure has a tubular shape and at the opening of the cavity a respective crown of removable means for attachment and electrical connection to the removable shielding means.

25. The device as claimed in claim 24, wherein the crown of removable means for attachment and electrical connection is made of a crown of second parts of snap fasteners, which are made of an electrically conductive material and are electrically connected to the shielding structure along edges of the opening of the shielding structure, whereas the sleeves or the covers are provided with first parts of the snap fasteners which are made of an electrically conductive material and are in electrical contact with the mesh made of electrically conductive material.

26. The device as claimed in claim 24, wherein the removable shielding means include one or more pre-shaped cushions, externally coated with an electrically conductive material, which delimit the opening of the cavity, and are provided with contact plates, which are electrically connected to the shielding structure and the body part.

27. The device as claimed in claim 26, wherein, as combined with or alternative to the contact plates, there are removable means for attaching the cushions to a wall delimiting the opening of the cavity, said removable means comprising a first part and a second part, the first part electrically connected to the shielding structure, and the second part electrically connected to the cushions in the form of a metal snap fastener.

28. The device as claimed in claim 26, wherein the cushions are inflatable.

29. The device as claimed in claim 24, wherein the crown of removable means for attachment and electrical connection comprises a flange having a L-shaped section, with respect to an axial plane, said flange being at least partially made of an electrically conductive material and being electrically connected to the shielding structure, whereas the removable shielding means comprises one of a cover and a sleeve, two covers, and two sleeves, which have, on a side fixed to the shielding structure, a coulisse and a fastening string around the L-shaped flange.

30. The device as claimed in claim 29, wherein the opening of the shielding structure has a polygonal shape with sides being arched, in an outwardly convex sense.

* * * * *